United States Patent
Mulatti et al.

(10) Patent No.: US 6,507,183 B1
(45) Date of Patent: Jan. 14, 2003

(54) METHOD AND A DEVICE FOR MEASURING AN ANALOG VOLTAGE IN A NON-VOLATILE MEMORY

(75) Inventors: Jacopo Mulatti, Latisana (IT); Marco Maccarrone, Palestro (IT)

(73) Assignee: STMicroelectronics S.r.l., Agrate Brianza (IL)

( * ) Notice: Subject to any disclaimer, the term of this patent is extended or adjusted under 35 U.S.C. 154(b) by 1 day.

(21) Appl. No.: 09/608,847

(22) Filed: Jun. 29, 2000

(30) Foreign Application Priority Data

Jul. 2, 1999 (IT) .......................... MI99A1474

(51) Int. Cl.$^7$ ............................................. G01R 17/06
(52) U.S. Cl. ................. 324/99 D; 324/158.1; 365/185.11; 365/189.09
(58) Field of Search ................ 324/99 D, 118, 324/139, 141, 170, 158.1; 365/185.03, 185.08, 185.11, 185.2, 189.02, 189.03, 189.09, 201, 244

(56) References Cited

U.S. PATENT DOCUMENTS

| | | | | |
|---|---|---|---|---|
| 3,696,403 A | * | 10/1972 | DiRocco | 324/99 D |
| 5,805,507 A | * | 9/1998 | Hull et al. | 365/185.2 |
| 5,815,435 A | * | 9/1998 | Van Tran | 365/185.03 |
| 6,094,368 A | * | 7/2000 | Ching | 365/185.03 |
| 6,429,641 B1 | * | 8/2002 | Montrose | 324/115 |

* cited by examiner

Primary Examiner—Michael Sherry
Assistant Examiner—Minh N. Tang
(74) Attorney, Agent, or Firm—Lisa K. Jorgenson; Robert Iannucci; Seed IP Law Group PLLC

(57) ABSTRACT

Presented is an analog voltage value measuring device for measuring any of a set of voltage references that are generated inside a memory architecture. The selected voltage to be measured is connected to a facility line through a multiplexer. The memory architecture includes a set of output buffers connected to a respective set of output pads. The device also includes a converter block, connected between the facility line and the output buffers of the memory architecture for converting a measured analog value of a voltage reference selected by the multiplexer to a digital value, which is presented on the output pads. A method of measuring an analog voltage value in a memory device is also disclosed. The method includes selecting an analog voltage value from the set of voltage values; transferring the selected analog value onto the facility line; converting the selected analog value to a digital value; and presenting the digital value on the output pads.

25 Claims, 7 Drawing Sheets

METHOD AND A DEVICE FOR MEASURING AN ANALOG VOLTAGE IN A NON-VOLATILE MEMORY

TECHNICAL FIELD

This invention relates to an analog voltage measuring device, particularly for use in a non-volatile memory architecture.

BACKGROUND OF THE INVENTION

Non-volatile memories, and especially flash memories, use a number of analog voltages for handling memory cell program and erase operations.

More particularly, it is known how to derive, from a reference voltage such as a bandgap voltage VBG, voltage references of elevated value to apply to the terminals of the memory cells. These elevated voltages include: a row decode reference VPCX and column decode reference VPCY for terminals of memory cells in the same row/column during a decoding step; and a program/erase voltage reference VPD for both the drain terminals of the selected cells during a writing step, and the source terminals of cells contained in a selected sector during an erasing step; a negative erase voltage reference HVNEG for the source terminals of cells contained in a decoded row during a negative gate voltage erasing step.

These elevated voltage references usually have different values according to the type of the modifying operation (program, erase, recover depleted cells) or verifying operation (program verify, erase verify, depletion verify) to be performed for the memory cells. Consequently, the operational structures which produce these voltage references need to be re-configurable, as well as stable and accurate, and able to provide reproducible outputs.

One example of a conventional operational structure adapted to generate a plurality of voltage references is shown at 1 in FIG. 1.

The operational structure 1 includes an operational amplifier 2 having a non-inverting input terminal T1 connected to a bandgap reference VBG, an enable input terminal T2 receiving an enable signal ENABLE, an inverting input terminal T3, and a supply terminal T4 connected to a high supply voltage reference HV.

The operational structure 1 also has an output terminal T5, outputting a high output voltage reference XREF. The high output voltage reference XREF is provided as a multiple of the bandgap reference VBG, through the operational amplifier 2.

The output terminal T5 is feedback connected to the inverting input terminal T3 via a resistive divider 3 and a passgate feedback network 4.

In particular, the resistive divider 3 includes first R1, second R2, third R3 and fourth R4 resistive elements connected together in series between the output terminal T5 of the operational amplifier 2 and a voltage reference, specifically a ground GND.

The passgate feedback network 4 includes first PG1, second PG2 and third PG3 passgates, which are connected between the inverting input T3 of the operational amplifier 2 and a first intermediate circuit node Y1 formed between the first and second resistive elements R1 and R2, a second intermediate circuit node Y2 formed between the second and third resistive elements R2 and R3, and a third intermediate circuit node Y3 formed between the third and fourth resistive elements R3 and R4, respectively.

The passgates PG1, PG2 and PG3 are driven by first X1, second X2 and third X3 control signals, respectively, as well as by their respective negated signals /X1, /X2 and /X3.

To provide re-configurability for the operational structure 1, the high output voltage reference XREF is made to vary with the values of the input voltages X1, X2 and X3, as illustrated schematically by the plots vs. time of FIG. 2.

In the test mode, the operational structure 1 is checked for proper operation by activating the control signals X1, X2, X3, the bandgap reference VBG, and the enable signal ENABLE, so that the state of the operational amplifier 2 can be reproduced at the output. After a time period which is dependent on a settling time of the output signal from the operational amplifier 1, it thus becomes necessary to access the value of the high output voltage reference XREF to verify the state of the operational amplifier.

Additionally to producing accurate references, the operational structure 1 is expected to provide reasonable settling times of the references, in order to make the overall duration of the modify/verify operations performed for the memory cells by the structure, the shortest possible.

Briefly, in the testing or debugging mode of a storage architecture which includes an operational structure 1 for generating a plurality of voltage references, it is of vital importance to check on the accuracy of the values and the settling time of all the high voltage references involved.

Conventional storage architectures allow for three different methods of performing the last-mentioned operation: using a test pad provided on the storage architecture chip for the application of microprobes; transferring the value of the high output voltage reference XREF outside of the operational structure 1 through an external terminal or pad already provided on the chip and serving some other function, such as handling a data or address input (user mode pad), in normal operation of the chip; and providing a pad separate from the above chip pads (dummy pad or test mode-only pad) for only handling access from the outside and measuring the high output voltage reference XREF.

These prior measuring methods imply, in particular, different layouts for the chip containing the storage architecture to be measured, as illustrated schematically in FIG. 3 by a memory chip 5 including an operational structure 1 to generate a high output voltage reference XREF on an output terminal T5, as previously described and shown in FIG. 1.

The memory chip 5 includes:
a test pad 6, which is connected directly to the output terminal T5 and, therefore, to the high output voltage reference XREF to be measured by the first of the aforementioned measuring methods;
a pad 7 of the user mode circuitry 8, which is already provided on the memory chip 5 and connected to the output terminal T5 via a de-coupling block 9 driven by a signal TEST to enter the test mode; and
a dedicated pad 10, which is added to the memory chip 5 and connected to the output terminal T5 through another de-coupling block 11 driven by the signal TEST to enter the test mode.

In particular, the de-coupling blocks 9 and 11 include respective MOS transistors, M1 and M2, having their source terminals connected to the output terminal T5, drain terminals connected to the pads 7 and 10, and gate terminals driven by the signal TEST through respective logic inverters INV1 and INV2.

The inverters INV1 and INV2 have control terminals connected to the drain terminals of the transistors M1 and M2, and thence to the output terminal T5.

The above methods of accessing and measuring the high voltage reference XREF inside the memory architecture, and the corresponding chip layouts, are quite simple but show important limitations, as specified herein below.

In a first method, the test pad 6 of the memory chip 5 is used.

To apply this measuring method, the memory chip 5 would have to be in an open package. The method cannot be used with the memory chip 5 mounted to a board. Furthermore, since micro-probes can only be used at room temperature, any measurements which rely on a temperature analysis are ruled out.

In a second method, the test pad 7 of the user circuitry 8 of the memory chip is used.

This measuring method can be applied also to memory chips 5 placed in sealed packages. The algorithm for entering the test mode, whereby the value of the high output voltage reference XREF to be measured is transferred to the pad 7, should not clash with the user mode circuitry 8, and must be implemented without making access to the other test modes of the memory chip 5 too complicated.

Specifically, the pad 7 for measuring XREF cannot be one of those to be selected for accessing the test modes of the memory chip 5. Were the pad 7 one for selection in other test modes, the associated test algorithms would have to provide for first forcing the value presented at the pad, and then reading the same. In this case, it would be impossible to utilize test algorithms which have been written for previous devices, and at any rate, once the high output voltage reference XREF is measured, another test algorithm could not be linked to the current one.

In addition, the method of testing XREF by means of a pad 7 of the user mode circuitry 8 may weaken the pad capability to withstand ESDs (ElectroStatic Discharges). In fact, for transferring the value of XREF outside the memory architecture, PMOS components, such as the transistor M1 of the de-coupling block 9, are added to the standard circuitry of pad 7 for communicating the pad to internal circuits of the memory chip 5, and these circuits may be susceptible to ESDs.

A typical example of a circuit connected to the pad 7 is the circuit for generating the bandgap reference VBG, which is usually made up of low-voltage components. In particular, should the gate terminal of the transistor M1 be floating toward ground, an EDS applied to the pad 7 could propagate to and damage the internal circuitry 8.

In the third method, the dedicated pad 10 of the memory chip 5 is used.

To use this measuring method, the package containing the memory chip 5 must be provided with more pins, in addition to those needed for normal operation (user mode) of the memory chip 5. This scheme is, therefore, a costly one.

Also, if the additional pin 10 is disconnected, the high output voltage reference XREF cannot be measured with the piece installed on a board.

This measuring method, and the additional pad 10 that goes with it, poses, moreover, the same ESD problems as previously discussed.

Finally, it will be appreciated that, as the number of voltage references to be measured increases, a larger number of measurement pads would have to be provided with any of the above-discussed measuring methods and chip layouts.

Until now, no method and circuit was available to determine, outside of the memory chip, instantaneous information about the level and settling time of the increased voltage references, using existing circuit structures within the memory chip.

SUMMARY OF THE INVENTION

Provided in embodiments of the invention is a method to measure an analog voltage value in a memory device. The method involves selecting one out of many analog voltage values that are generated inside the memory device and transferring the selected analog value onto a communication line. From the communication line, the selected analog value is converted into a digital value and then the digital value is sent to the output pads of the memory chip.

Another embodiment of the invention includes a memory circuit containing a device for measuring analog voltages. One of the available voltages is selected and passed through a multiplexer to a facility line. An analog to digital converter accepts the voltage from the facility line and converts it into a digital signal and passes it to a set of memory output pads.

In one specific embodiment, the analog to digital converter is a counter-ramp converter which includes a hysteresis type of comparator. In some embodiments, a n-bit counter is used, which is already present in prior art memory devices.

In yet a further embodiment, the measuring device contains a small memory device that has been programmed with expected or anticipated analog voltage values. Thereafter, checking the voltage requires only the checking to see if the actual value of the voltage to be read is within a given range around the stored voltage value.

The invention relates, particularly but not exclusively, to a measuring device for non-volatile flash memory architectures, and the description which follows will cover this field of application for convenience of explanation only.

DETAILED DESCRIPTION OF THE INVENTION

Figure 1:
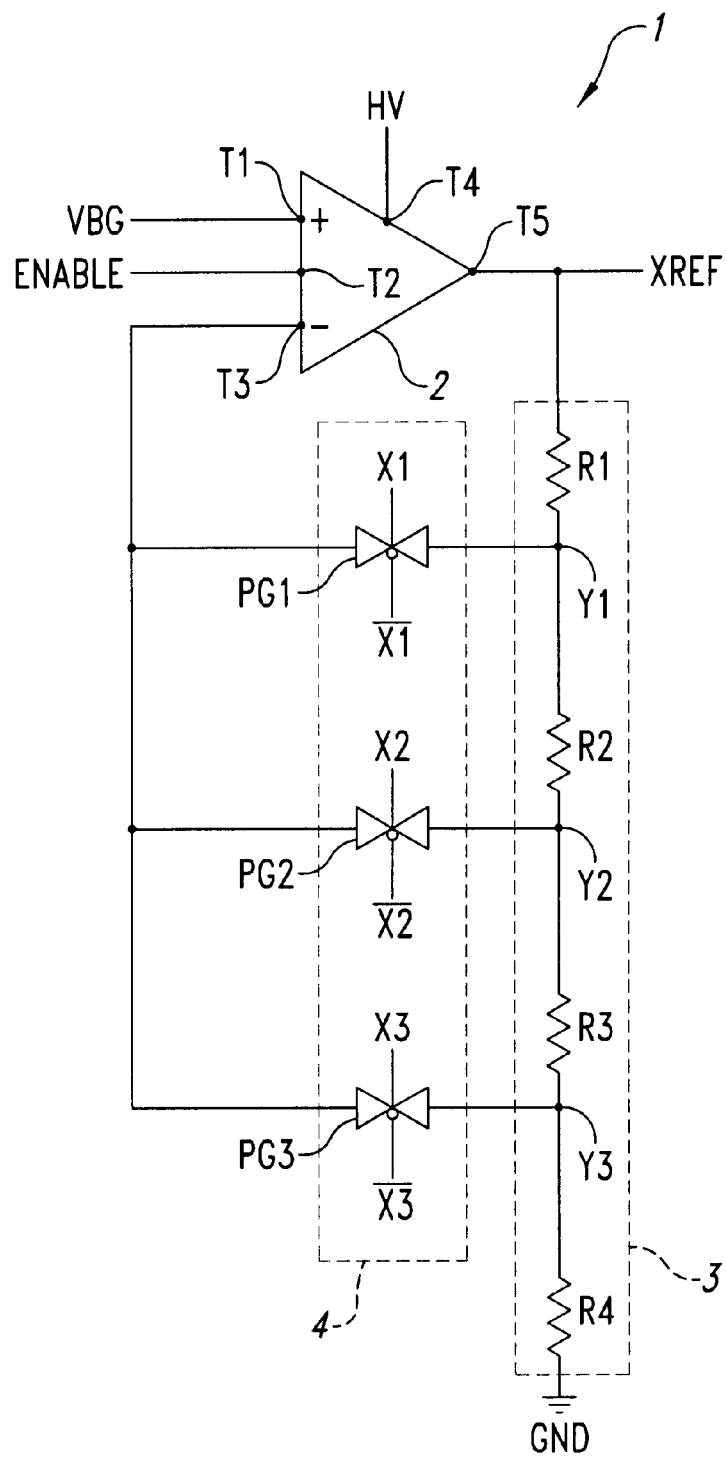
FIG. 1 is a schematic diagram of an example of a conventional type of voltage reference generator.
Figure 2:
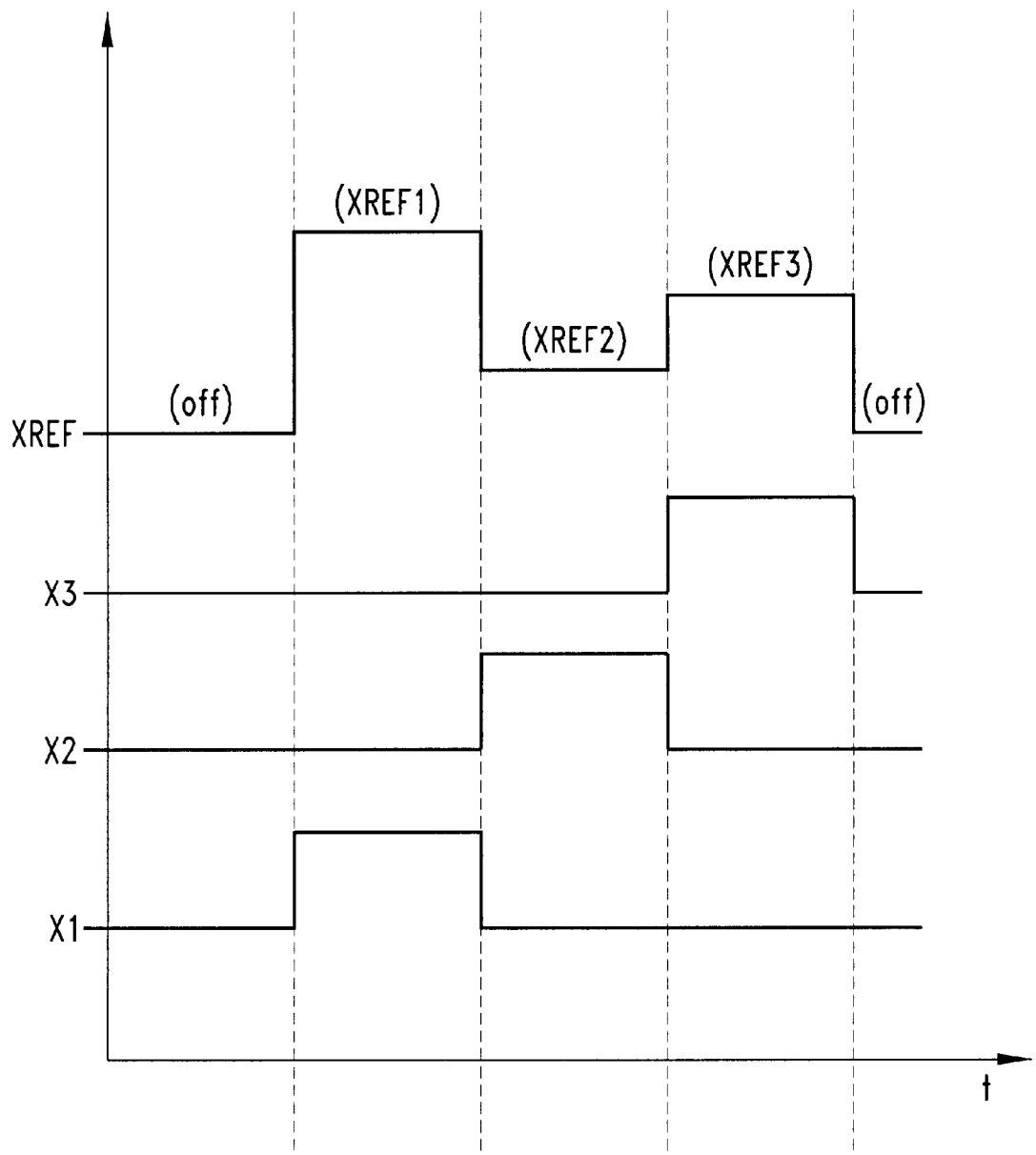
FIG. 2 is a graph showing internal voltage references over time of the operational structure of FIG. 1.
Figure 3:
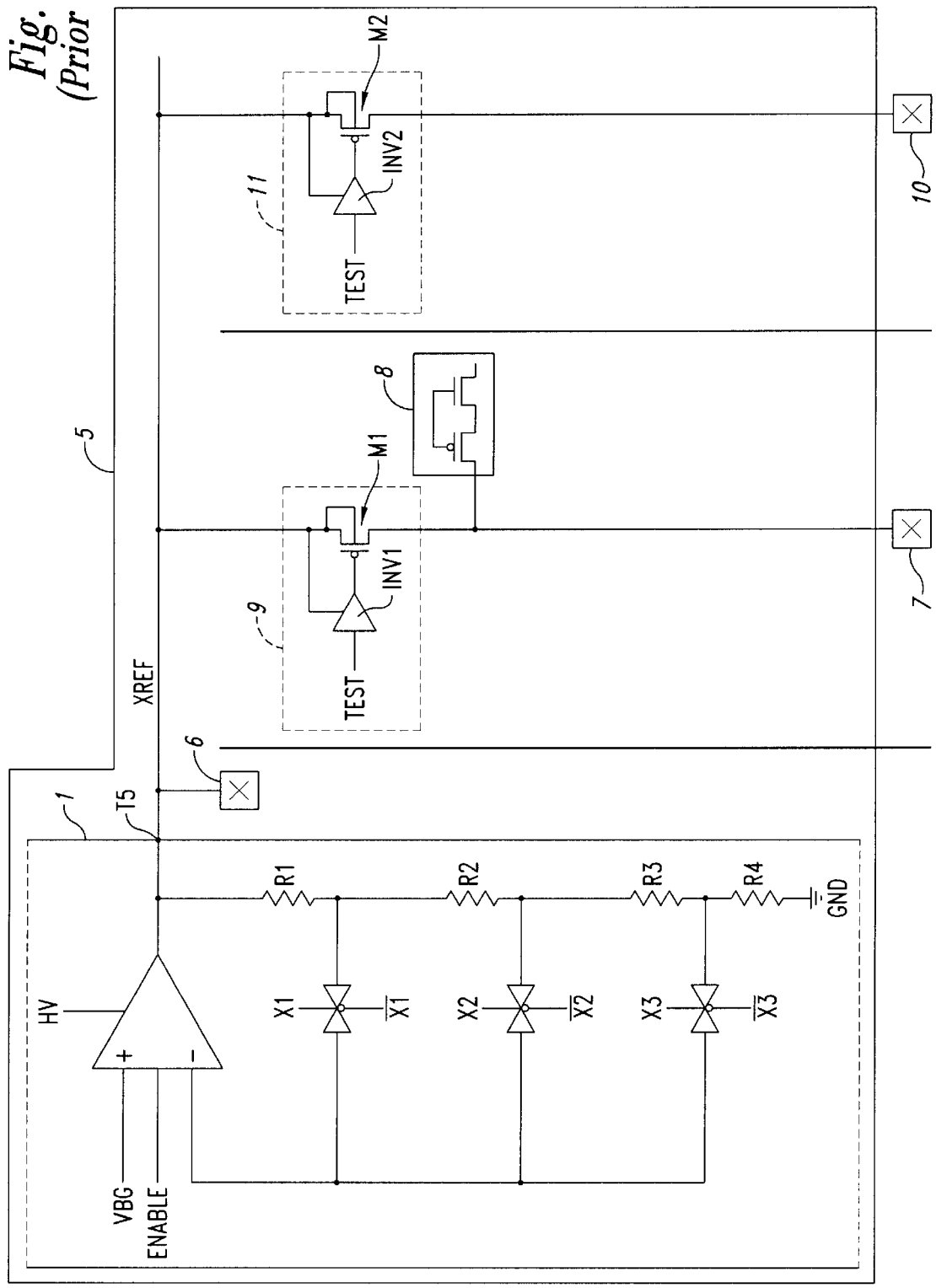
FIG. 3 is a schematic diagram of a conventional memory chip incorporating the operational structure of FIG. 1.
Figure 4:
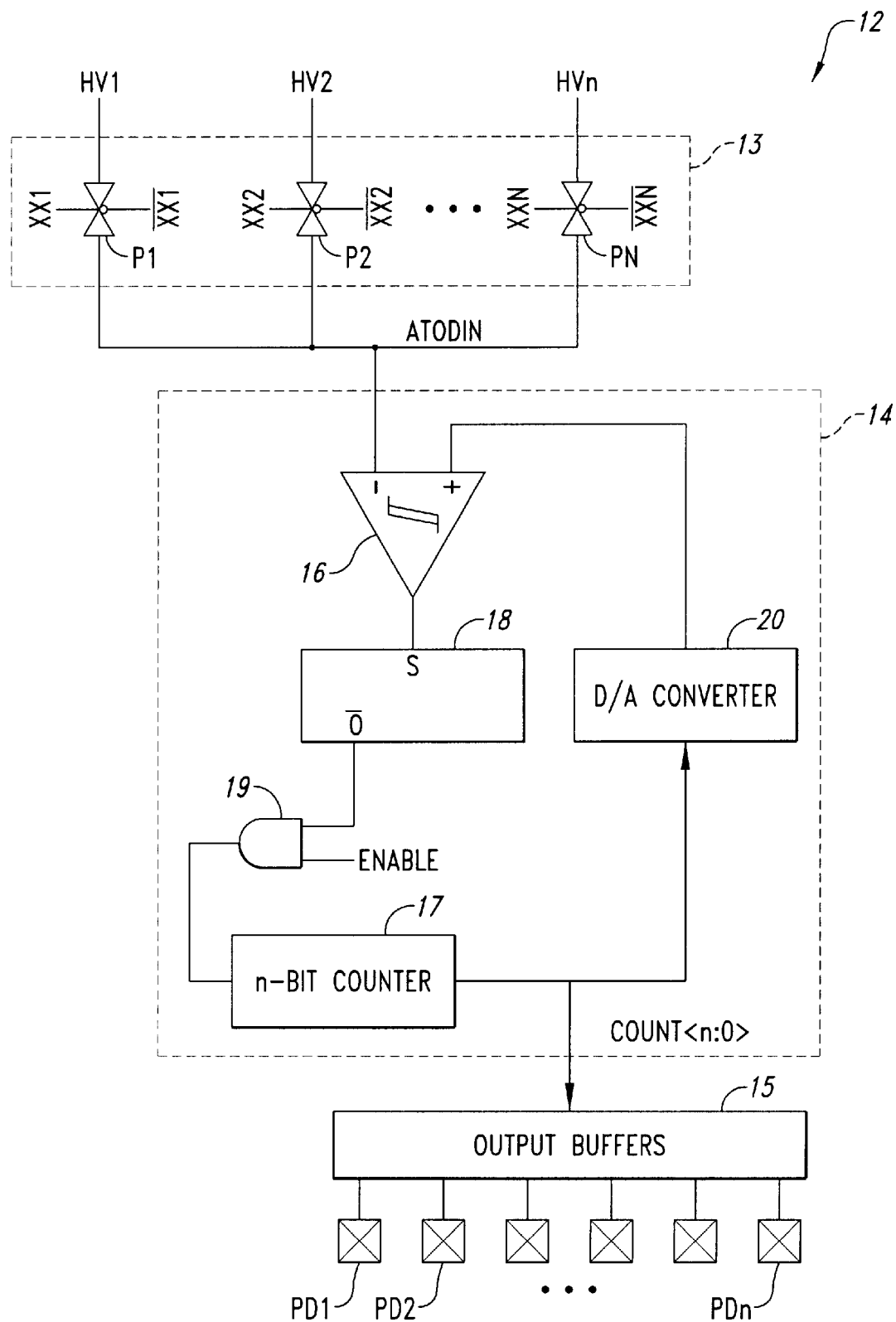
FIG. 4 is a schematic diagram of a measuring device which can be used to measure analog voltages according to embodiments of the invention.

With reference to the drawing views, and particularly to FIG. 4, a measuring device according to an embodiment of the invention is generally shown at 12 in schematic form.

The measuring device 12 includes a plurality of high voltage references HV1, HV2, . . . , HVn which are generated within a memory architecture, containing the measuring device 12. The voltage generators are omitted from FIG. 4 for the sake of simplicity.

These high voltage references HV1, HV2, . . . , HVn are connected to a facility line ATODIN through a multiplexer 13.

In particular, the multiplexer 13 includes a plurality of passgates P1, P2, ..., Pn which are connected between the high voltage references HV1, HV2, ..., HVn and the facility line ATODIN, and are driven by a number of control signals XX1, XX2, ..., XXN and negated signals /XX1, /XX2, ..., /XXN which are set by a test algorithm to select a given input leg, and accordingly, a voltage value for measurement.

The measuring device 12 further includes a converter block 14, which is connected between the facility line ATODIN and output buffers 15 of the memory architecture, the buffers being connected to a plurality of output pads PD1, PD2, ..., PDn. Advantageously, the converter block 14 is operative to convert an analog value, as measured for a voltage reference selected by the multiplexer 13, into a digital value COUNT<n:0> presented on the plurality of output pads PD1, PD2, ..., PDn, as described in greater detail below.

More particularly, the converter block 14 is a counter-ramp type of converter, and includes a hysteresis comparator 16 having an inverting input terminal connected to the facility line ATODIN and an output terminal connected to an n-bit counter 17 through a series of a flip-flop 18 and an enable logic gate 19, whereto an enable signal ENABLE is input.

The converter block 14 further includes a digital-to-analog converter 20 which is feedback connected between the n-bit counter 17 and a non-inverting input terminal of the hysteresis comparator 16.

Advantageously, the n-bit counter 17 of the converter block 14 can be an n-bit counter already provided within the memory architecture, specifically in the state machine that is to handle the memory program and erase operations, where it is utilized for counting the memory programming and erasing steps in the user mode.

In addition, the digital value COUNT<n:0> output from the n-bit counter 17 is transferred to the plurality of output pads PD1, PD2, ..., PDn through existing output buffers 15 of the memory architecture.

Thus, the measuring device 12 is implemented by the addition of a hysteresis comparator and a digital-to-analog converter to existing circuitry in its associated memory architecture, and by suitably modifying the multiplexer associated with the output buffers 15.

Advantageously, the digital-to-analog converter 20 makes the measuring device 12 flexible in the respect of accuracy and space requirements. In fact, with the number of output buffers 15 being fixed beforehand (and usually equal to 8, 16, 32, ... bits), the number of conversion steps can be selected at the designing stage to suit the requisite accuracy of the voltage measurements to be made. Accordingly, the area requirements of the digital-to-analog converter 20 on the chip that accommodates both the memory architecture and the measuring device 12 can be determined beforehand.

Figure 5:
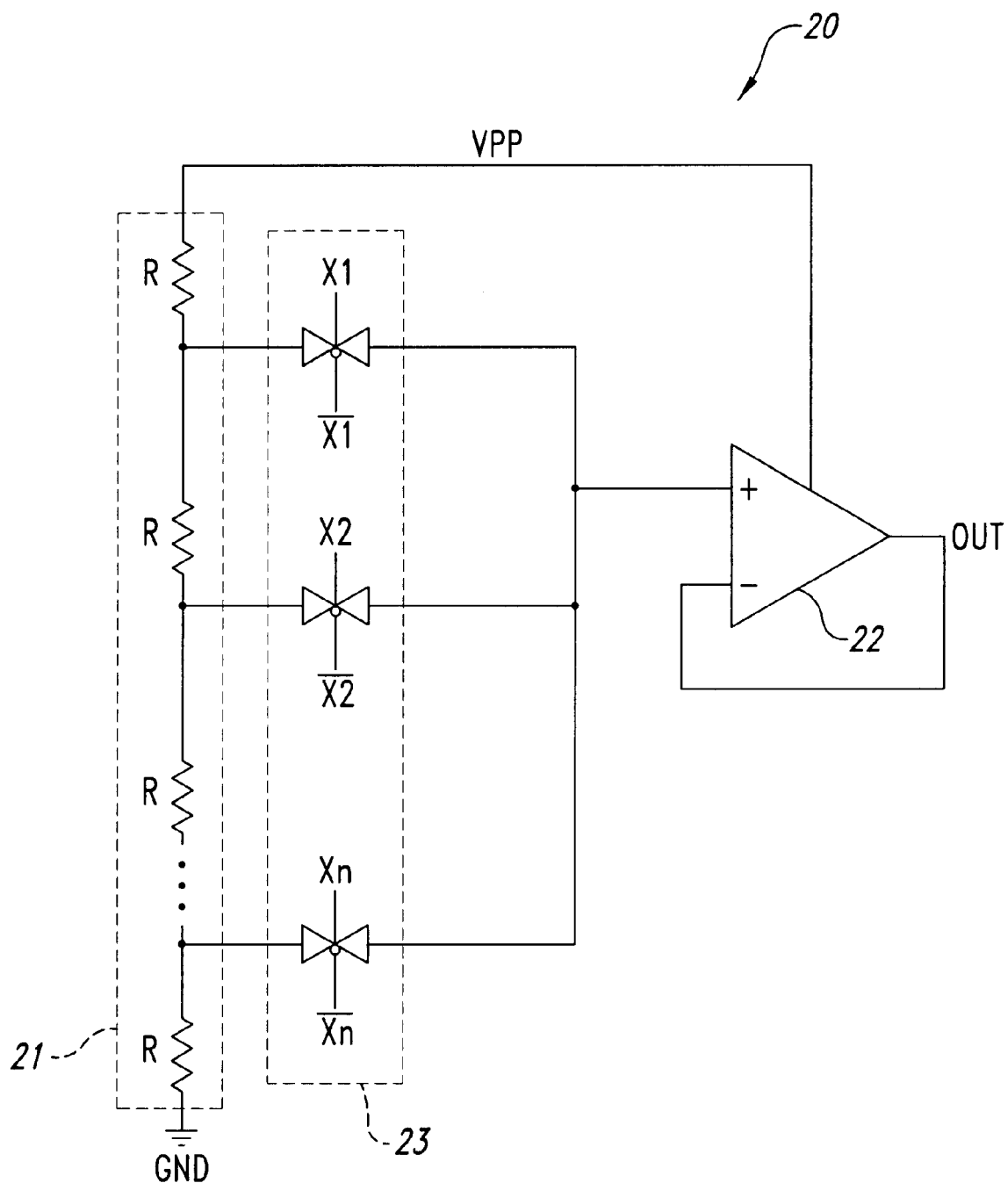
FIG. 5 is a more detailed schematic diagram of the measuring device shown in FIG. 4.

Shown schematically in FIG. 5 is an embodiment of a digital-to-analog converter 20 for use in the measuring device 12.

In particular, the digital-to-analog converter 20 of FIG. 5 is applicable to flash memory architectures having two supply voltages, Vdd and Vpp, with Vpp higher than Vdd.

The digital-to-analog converter 20 includes a voltage divider 21, which is connected between the supply voltage reference Vpp and ground GND and has a number of resistive elements R. In this embodiment, the resistance elements R have the same resistance R, but could also be different from one another in other embodiments.

The digital-to-analog converter 20 further includes an operational amplifier 22, in a buffer configuration of unity gain, that is having its output terminal connected to the inverting input terminal, which amplifier is supplied the supply voltage Vpp.

The operational amplifier 22 also has a non-inverting input terminal connected to the voltage divider 21 through a multiplexer 23 which includes a plurality of controlled passgates connected to interconnection nodes of the resistive elements contained in the voltage divider 21.

In particular, the operational amplifier 22 outputs a voltage signal OUT, which can vary within the range of 0 to Vpp according to which interconnection node happens to be connected to the non-inverting input terminal of the operational amplifier 22 through the multiplexer 23.

The digital-to-analog converter 20 has, therefore, a conversion step of Vpp/k, where k is the number of resistive elements contained in the voltage divider 21.

Advantageously, the supply voltage reference Vpp is used as an external voltage reference in order to re-construct the measured voltage value on the basis of the information read from the output buffers 15.

Where this digital-to-analog converter 20 is used in a memory architecture incorporating a measuring device 12, having j input pads, the number k of resistive elements in the voltage divider 21 would not be larger than $2^{j-1}$.

Actually, the space requirements of the digital-to-analog converter 20 increase with k, since its resistance and the number of passgates in the multiplexer 23 also increase. The designer of the memory architecture should select a value $k<2^{j-1}$ to suit the overall space restrictions and/or the memory area that can be allowed for the digital-to-analog converter 20.

Thus, as previously explained, once the space limits for the memory architecture are set, the accuracy of the digital-to-analog converter 20 is fixed concurrently.

In order to use the output buffers for other test algorithms, it will suffice to disable the transfer of data from the n-bit counter 17 to the output buffers 15.

Also, if the n-bit counter 17 is to be disengaged from an analog voltage measuring operation, latching devices can be added to the memory architecture which would be connected to the outputs of the n-bit counter 17 and dedicated to storing the resulting measurement data.

This measuring device 12 allows the value attained by any analog voltage generated inside its associated memory architecture to be verified, and the verification is performed from outside the memory chip. In particular, the data provided from the converter block 14 is passed to the outside through the output buffers 15, for subsequent interpretation by a person or machine in charge of testing the memory architecture.

Figure 6:
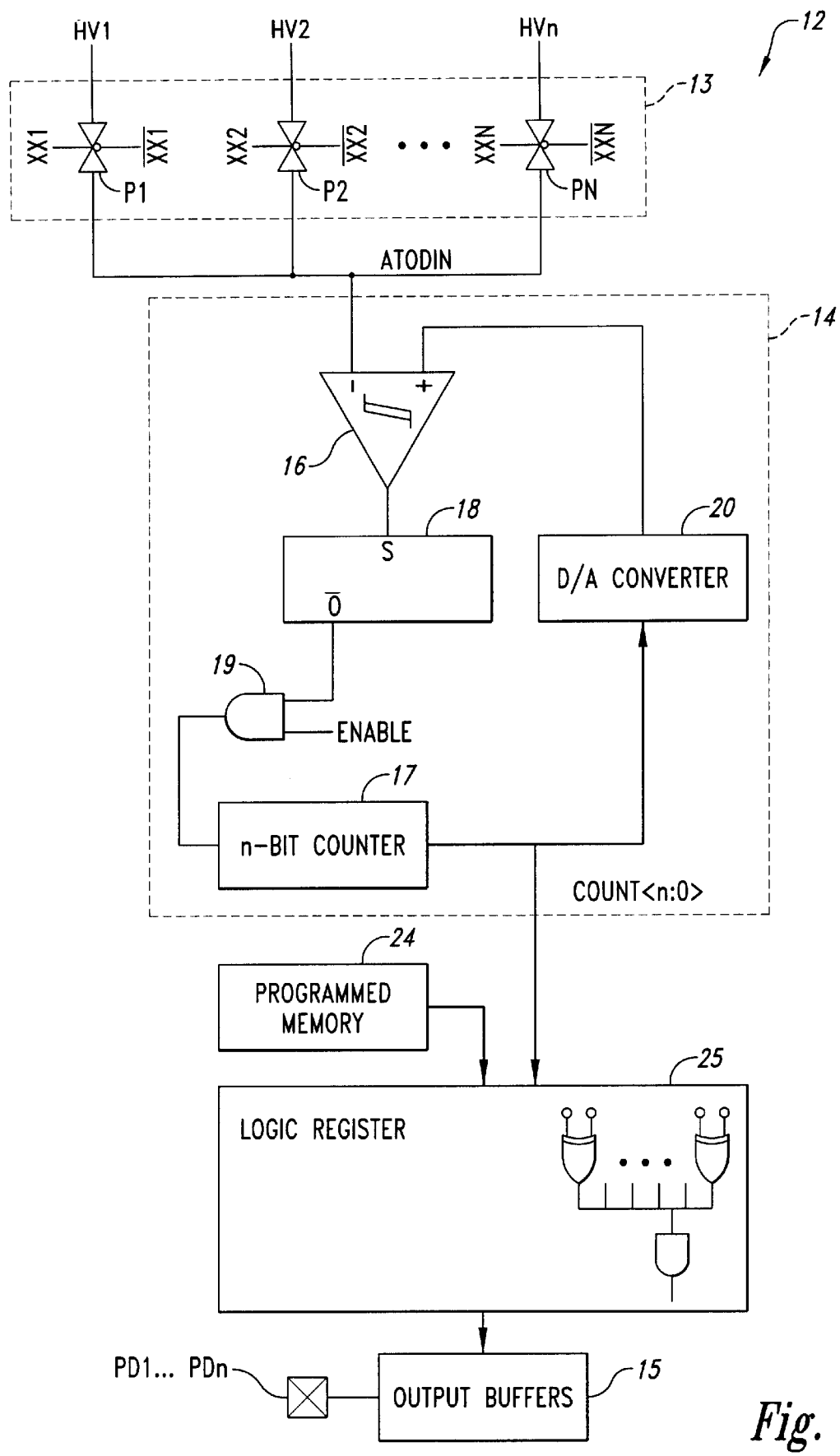
FIG. 6 is a schematic diagram of a measuring device which can be used to measure analog voltages according to other embodiments of the invention.

FIG. 6 shows schematically another embodiment of the measuring device 12, whereby the speed of the operations of testing internal analog voltages of a memory architecture is increased.

In particular, the measuring device 12 of FIG. 6 additionally includes a non-volatile memory device 24, which has been programmed with anticipated conversion bits for each of the analog voltages to be measured.

This non-volatile memory device 24 is connected to a logic register 25, itself connected between the n-bit counter 17 and the output buffers 15.

Each time that an analog voltage measurement is taken, the measuring device 12 will compare the binary equivalent of the voltage value obtained with an anticipated value stored in the non-volatile memory device 24, based on a logic scheme of the XNOR type, by means of the logic register 25. The result of the comparison is a single bit which is attached a logic value, e.g., a value of "1", when the input values match.

This bit is then transferred outside the chip through one of the output buffers 15, if a single analog voltage is to be tested, or alternatively stored into a latch register of a set of registers (not shown) by a single operation through the output buffers 15, if a number of analog voltages are to be tested and the results of the comparisons communicated.

Advantageously, this modification of the measuring device 12 according to the invention allows the testing operations for the analog voltages to be sped up, by entering an automatic test mode wherein the anticipated values of such voltages are stored in the non-volatile memory device 24.

Furthermore, the measuring device 12 may be modified to evaluate the settling time value of a given analog voltage.

Figure 7:
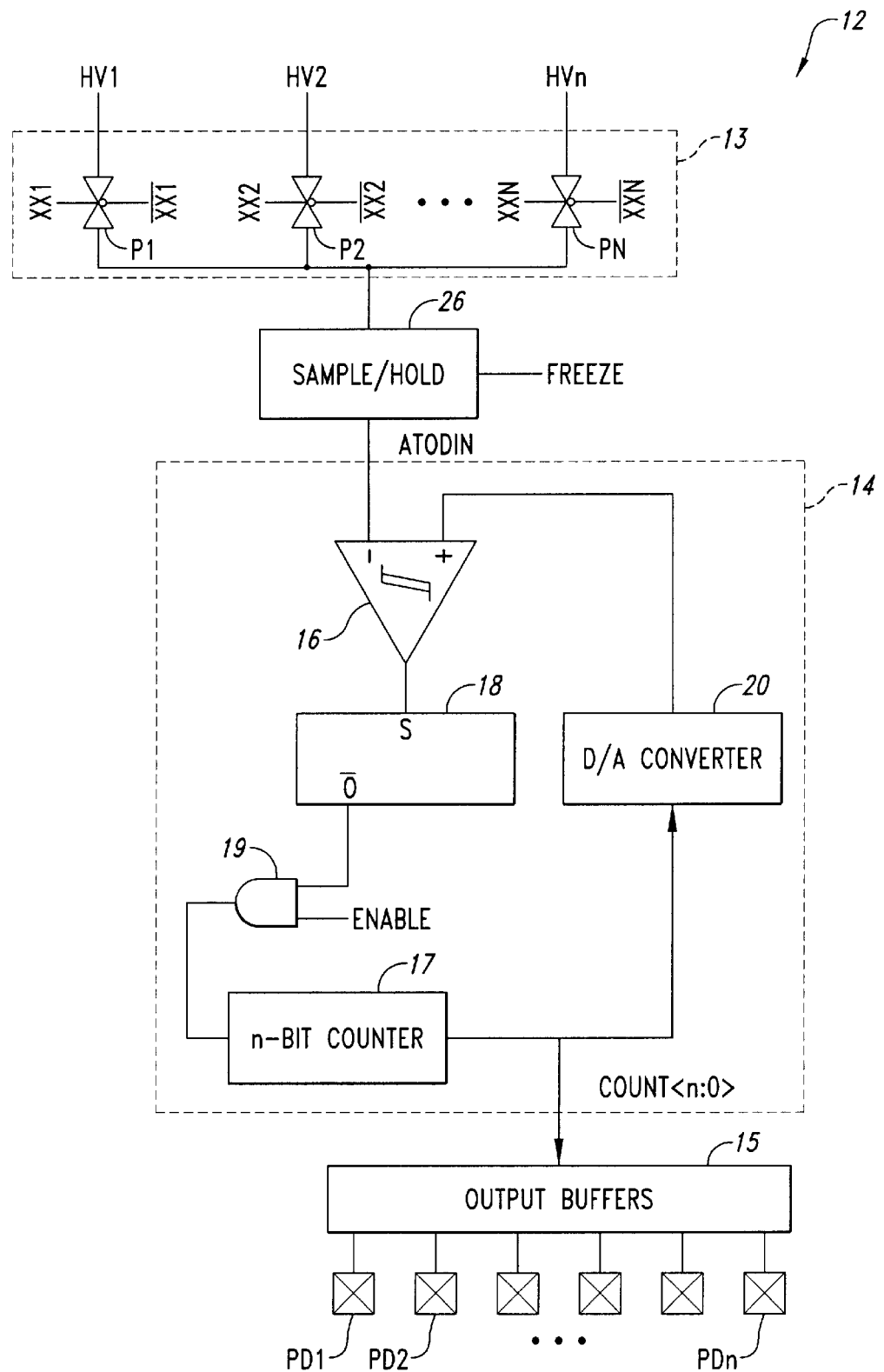
FIG. 7 is a schematic diagram of a measuring device which can be used to measure analog voltages according to other embodiments of the invention.

FIG. 7 shows a further embodiment of the measuring device 12 for evaluating the settling time.

In particular, the measuring device 12 of FIG. 7 includes a sample-and-hold device 26, which is connected between the multiplexer 13 and the inverting input of the hysteresis comparator 16 in the converter block 14 and is controlled by an external control signal FREEZE.

Briefly, the sample-and-hold device 26 will "freeze" the value of an analog voltage of interest at a time t+Δt subsequent to the power-on time t by means of the signal FREEZE, without waiting for the voltage of interest to attain steady-state. The measuring device 12 will then assess whether the settling time value measured for the voltage of interest approximates an anticipated value.

The modification of FIG. 7 may also include a non-volatile memory device 24 associated with a logic register 25 for automating the settling time measuring operations, similar as described hereinabove in connection with the operations of testing analog voltage values.

To summarize, the measuring device 12 of embodiments of this invention offers the following advantages: the binary signals COUNT<n:0> representing the binary values of the analog voltages to be measured are immediately made available on the output pads P1, P2, ... ,Pn through the output buffers 15, and can therefore be used as in a standard user mode reading operation; by accessing information of interest through the output buffers 15, analog voltages can also be measured in memory devices sealed in a package or mounted on a board, with no restrictions on the temperature at which the measurements are made; the n-bit counter 17 employed in the measuring device 12 of embodiments of the invention utilizes the counter of the state machine in the memory architecture associated with the measuring device, the latter counter being normally held inoperative during the test steps of measuring the voltages references generated inside the memory architecture, so that no dedicated counter becomes necessary; the construction of the measuring device 12 according to embodiments of the invention generally involves no more than a slight increase in area requirements, to arrange for multiplexing the data to be delivered to the output buffers 15; by utilizing existing output buffers 15 in the memory architecture, the finished integrated device can be made ESD-resistant, it being the output buffer 15 drive that has been changed, not the buffer own structure or any circuitry connected thereto; the digital-to-analog converter 20 provided in the measuring device 12 makes the latter flexible in the respect of its accuracy and occupied area; the addition of a non-volatile memory device 24 and a logic register 25 in the measuring device 12 in embodiments of this invention allows the analog voltage testing operations to be speeded up by entering an automatic test mode; and the sample-and-hold device 26 provided allows the measuring device 12 to assess the settling time value for a given analog voltage by "freezing" the voltage value at a given time, without being forced to wait for a steady state to be attained.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. An analog voltage value measuring device in a memory architecture including a plurality of output buffers coupled to a corresponding plurality of output pads, the measuring device comprising:
   a plurality of voltage generators structured to generate a plurality of voltage references;
   a multiplexor coupled to the voltage generators and structured to connect a selected one of the voltage references to a facility line; and
   a converter block connected between the facility line and the output buffers of the memory architecture and structured to convert a measured analog value of the selected voltage reference to a digital value and present the digital value on the plurality of output pads, to provide a measurement of the selected voltage reference.

2. The measuring device according to claim 1 wherein the converter block is a counter-ramp converter and includes:
   a hysteresis comparator having an inverting input terminal coupled to the facility line and having an output terminal coupled to an n-bit counter through a series of a flip-flop and an enable logic gate structured to accept an enable signal.

3. The measuring device according to claim 2 wherein the n-bit counter is also structured to perform memory program and erase operations in the memory architecture.

4. The measuring device according to claim 2, wherein the presence of the enable signal is effective to disable the presentation of data from the n-bit counter to the output buffers.

5. The measuring device according to claim 2, further comprising a plurality of latch devices connected to outputs of the n-bit counter and structured to store obtained measurement data, and structured to allow the n-bit counter to disengage from the analog voltage measuring operation.

6. The measuring device according to claim 2 wherein the converter block further includes a digital-to-analog converter feedback connected between the n-bit counter and a non-inverting input terminal of the hysteresis comparator.

7. The measuring device according to claim 6, wherein the digital-to-analog converter includes:
   a voltage divider connected between a first and a second voltage references, and connected, via a multiplexer, to an operational amplifier being supplied the first voltage reference and having a unity gain buffer configuration, the voltage divider structured to output a varying voltage signal within a predetermined range of values.

8. The measuring device according to claim 7, wherein the multiplexer includes a plurality of controlled passgates respectively connected to interconnection nodes of a plurality of resistive elements contained in the voltage divider, and structured to determine the varying value of the voltage signal within the predetermined range of values.

9. The measuring device according to claim 8, wherein the plurality of resistive elements all have a same resistive value.

10. The measuring device according to claim 8 wherein a conversion step of the digital-to-analog converter is determined by a number of the resistive elements contained in the voltage divider.

11. The measuring device according to claim 1, further comprising:
a non-volatile memory device that has been programmed with conversion bits anticipated for each of the plurality of analog voltages able to be measured, the non-volatile memory device coupled to a logic register which is in turn coupled between the converter block and the plurality of output buffers.

12. The measuring device according to claim 11, wherein the logic register is structured to compare a binary equivalent of the measured voltage value with an anticipated value stored in the non-volatile memory device, using a series of XNOR logic gates, and deliver the comparison results to the plurality of output buffers in the form of single bits.

13. The measuring device according to claim 12, further comprising:
a set of latch registers structured to store the results of a number of successive comparisons carried out by the logic register.

14. The measuring device according to claim 1, further comprising a sample-and-hold device, coupled between the multiplexer and the converter block, controlled by an external control signal, and structured to evaluate a settling time value of the selected analog voltage.

15. A method of statically measuring an analog voltage value in a memory device, comprising:
selecting an analog voltage value from a plurality of voltage values generated inside the memory device;
transferring the selected analog value onto a facility line;
converting the selected analog value to a digital value; and
presenting the digital value on a plurality of output pads of the memory device.

16. The measuring method according to claim 15 wherein selecting an analog voltage value from a plurality of voltage values comprises operating a multiplexer coupled between the plurality of voltage values and the facility line.

17. The measuring method according to claim 15 wherein converting the selected analog value to a digital value comprises utilizing a counter-ramp type of converter block comprising at least one n-bit counter.

18. The measuring method according to claim 17, wherein converting the selected analog value to a digital value is enabled by the presence of an enable signal being input to an enable logic gate contained in the converter block and connected to the n-bit counter.

19. The measuring method according to claim 17, wherein converting the selected analog value to a digital value comprises utilizing an n-bit counter in the memory device and structured as a state machine for programming and erasing cells within the memory device.

20. The measuring method according to claim 15, further comprising converting the digital value to a further analog value and inputting the further analog value to a converter block.

21. The measuring method according to claim 15, further comprising:
comparing the digital value to an anticipated value stored in a non-volatile memory device; and
presenting the result of the comparison, in the form of single bits, on output buffers being connected to the plurality of output pads.

22. The measuring method according to claim 21 wherein comparing the digital value to an anticipated value comprises using an XNOR type of logic scheme.

23. The measuring method according to claim 21, further comprising storing the results of a number of successive comparisons carried out for a number of selected analog voltages in a set of latch registers.

24. The measuring method according to claim 15, further comprising evaluating a settling time value of the selected analog voltage on a sample-and-hold device controlled by an external control signal.

25. An analog voltage measuring device for measuring an analog voltage, comprising:
a comparator having a first input terminal coupled to the analog voltage, a second input terminal coupled to a reference voltage, and an output;
a flip-flop having an input and an output, the input being coupled to the output of the comparator;
an n-bit counter having an input coupled to the output of the flip-flop and an output at which a digital value corresponding to the analog voltage is produced; and
a digital-to-analog converter having an input coupled to the output of the n-bit counter and an output coupled to the second input terminal of the comparator, the digital-to-analog converter being structured to convert the digital value at the output of the n-bit counter into the reference voltage.

* * * * *